(12) United States Patent
Nealy et al.

(10) Patent No.: US 6,172,627 B1
(45) Date of Patent: Jan. 9, 2001

(54) DYNAMIC DIGITAL TO SYNCHRO CONVERTER

(75) Inventors: Windsor B. Nealy, Seminole; Wesley C. Sewell, Dunedin, both of FL (US)

(73) Assignee: Honeywell, Inc., Morristown, NJ (US)

( * ) Notice: Under 35 U.S.C. 154(b), the term of this patent shall be extended for 0 days.

(21) Appl. No.: 09/078,100

(22) Filed: May 13, 1998

(51) Int. Cl.[7] .................................................. H03M 1/48
(52) U.S. Cl. ........................................... 341/117; 341/144
(58) Field of Search ................................... 341/117, 144, 341/112; 318/605, 636

(56) References Cited

U.S. PATENT DOCUMENTS

| | | | |
|---|---|---|---|
| 3,806,917 | 4/1974 | Gronner et al. | 340/347 DA |
| 4,250,544 | * 2/1981 | Alley | 364/110 |
| 4,270,077 | * 5/1981 | Swartz et al. | 318/661 |
| 4,703,307 | * 10/1987 | James et al. | 341/117 |
| 4,977,446 | * 12/1990 | Shiomi et al. | 358/60 |
| 5,173,696 | * 12/1992 | Howard et al. | 341/117 |

FOREIGN PATENT DOCUMENTS 59-167113   9/1984   (JP) ............................... H03K/13/02

OTHER PUBLICATIONS

"Precision Modulation Technique" by R. A. Schulz from the IBM Technical Disclosure Bulletin. vol. 16, No. 12, May 1974, pp. 3858–3860, IBM Corp. New York, US.

* cited by examiner

Primary Examiner—Peguy JeanPierre
(74) Attorney, Agent, or Firm—Kris T. Fredrick

(57) ABSTRACT

A digital to synchro converter converts digital values to an analog synchro signal. The values are mapped in a memory and sent to a digital to analog converter converting the digital values to analog values. Sample and hold circuitry is then used to create the analog synchro signal.

18 Claims, 5 Drawing Sheets

DYNAMIC DIGITAL TO SYNCHRO CONVERTER

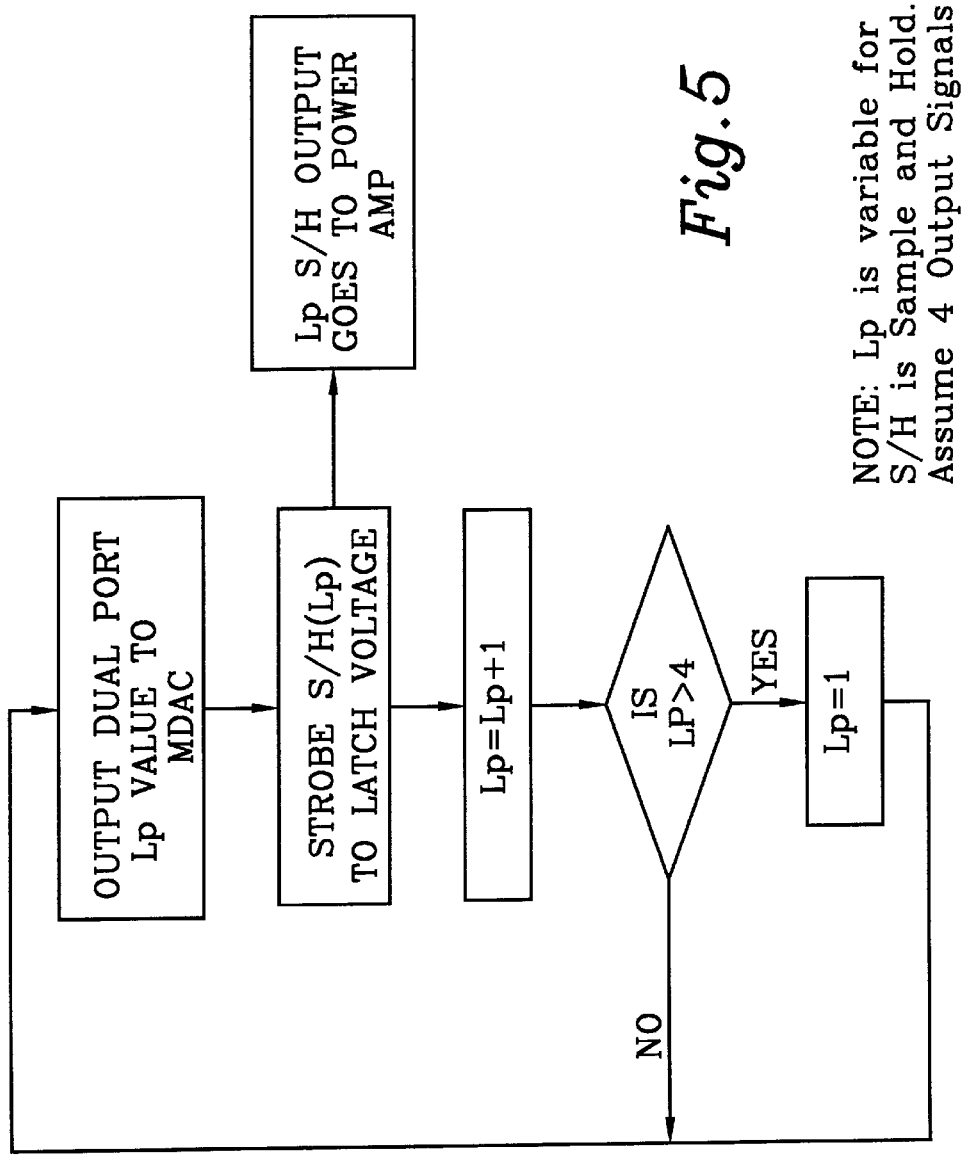

DYNAMIC DIGITAL TO SYNCHRO CONVERTER

BACKGROUND OF THE INVENTION

Prior art techniques of measuring mechanical shaft angle are numerous. One such method is to use an electromechanical device generically called an resolver type position transducer. A typical resolver type position transducer would be comprised of two disks, one which rotates relative to the other. One of the disks would house the stator windings (does not move) while the other houses the rotor winding.

Generally, two separate windings are physically arranged on the stator so that electrical signals from these two windings are coupled in quadrature onto the rotor windings of the second member. The magnitude of the coupling for each of these winding pairs is dependent upon the mechanical shaft angle present between the stator and the rotor. Very often, numerous winding poles are configured into the device so that an electrical/mechanical geardown ratio is achieved. For example, a mechanical rotation of 180 degrees might correspond to an electrical phase shift of 18,000 degrees if the geardown ratio were 100 (corresponding to 200 pole pairs).

The relation between the input and output signals of a resolver type position transducer are related to the geometry of the resolver type position transducer stator and rotor windings. Since this geometry changes as the rotor changes its position, then it becomes possible to extract positional information by comparing the output and input signals of resolver type position transducer to create an output known as a synchro signal. Various methods of accomplishing this measurement to provide the synchro signal have been devised using both amplitude and phase modulation techniques and are known as digital to synchro converters.

In digital to synchro converters that currently exist, at least two Multiplying Digital to Analog Converters (MDACs) are used for each synchro. When multiple synchro outputs are required, this converter is both costly for the materials as well as complex for manufacturing and operation. It would be beneficial for a simpler design which is low cost.

SUMMARY OF THE INVENTION

A digital to synchro converter converts digital values to an analog synchro signal. The values are mapped in a memory and sent to a digital to analog converter converting the digital values to analog values. Sample and hold circuitry is then used to create the analog synchro signal based on the analog values.

BRIEF DESCRIPTION OF THE FIGURES

FIG. 5 shows a flow diagram of the sequential control in the second processor.

DETAILED DESCRIPTION OF THE PRESENT INVENTION

Figure 1:
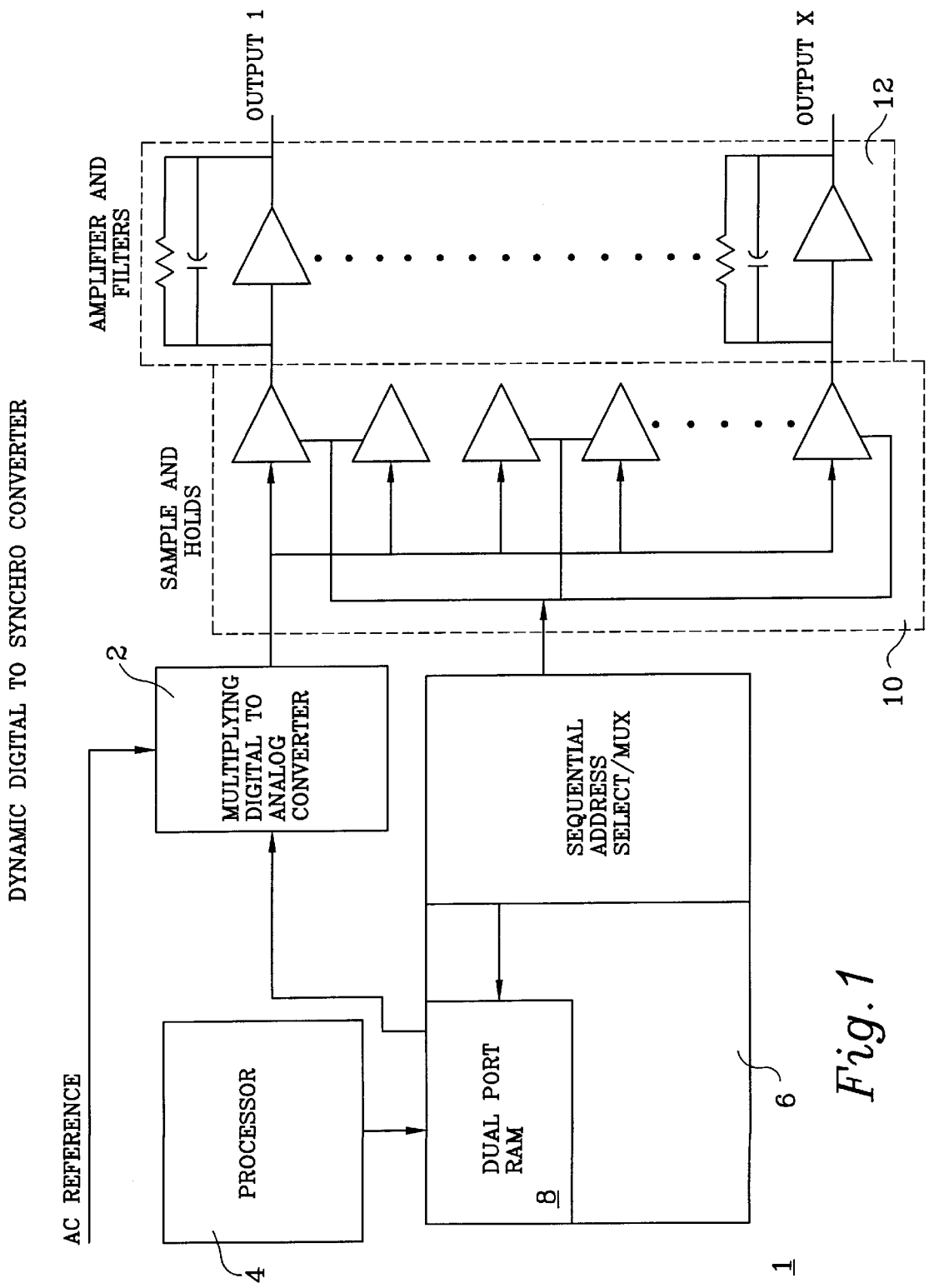
FIG. 1 shows the dynamic digital to synchro converter of the present invention.
Figure 2:
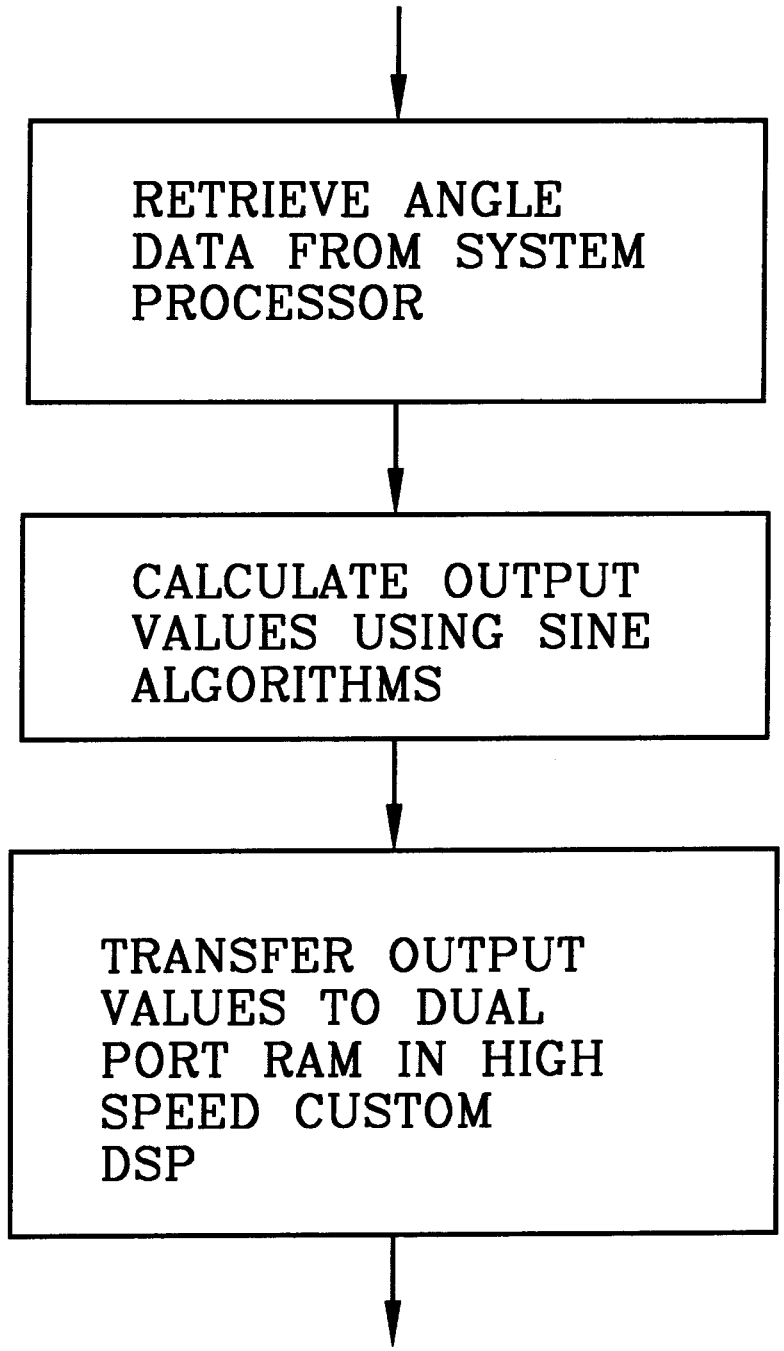
FIG. 2 shows a flow diagram of the operations in the main processor of the dynamic digital to synchro converter.

The present invention is a dynamic digital synchro converter 1 as shown in FIG. 1. The present invention is dynamic in that it only utilizes one Multiplying Digital to Analog Converter (MDAC) 2 with multiple Sample and Hold circuitry for the digital to synchro conversion. A main processor 4 produces synchro voltage outputs. As seen in FIG. 2, the main processor 4 retrieves the synchro values in the form of angle data from a system processor which is not shown. The present embodiment uses a sine wave to represent the analog synchro output and a sine algorithm is used to calculate the values for this representation in the main processor 4. Sine algorithms are well known in this area of technology and will not be discussed in any further detail here. The values are output to a dual port RAM memory in a second processor via high speed custom Digital Signal Processing (DSP). DSP is so well known in this are of technology that it will not be discussed in any further detail here.

Looking back at FIG. 1, it can be seen that the synchro values from the main processor 4 are transmitted to a second processor 6 with a dual port RAM memory 8. In the present embodiment, a dual port RAM is used, but any memory to store these values can be used and the dual port RAM is used for example purposes only. Each synchro value is memory mapped in the dual port RAM 8 by a specific address. The synchro values are then transmitted to a single MDAC 2 to be converted. The processor 6 sequentially addresses the memory to update the MDAC 2 with values that correspond to the sample and hold values that sample and hold the digital value through sample and hold circuitry 10. The control of the sequential addressing is critical to ensure that the correct values are sampled and held to create an accurate analog synchro output.

As can be seen, the MDAC 2 produces the values to the sample and hold circuitry 10 to provide the output. The timing for the values to be sample and held and the correct values to be processed are essential to the operation of the dynamic digital to synchro converter 1 of the present invention. The second processor 6 is the means that controls these operations of which values are to be sent to the sample and hold circuitry 10 from the MDAC 2 as well as when the value is to be sent. The signals from the sample and hold circuitry 10 are then amplified and filtered by an amplifier and filter 12 before being output. The amplifiers amplify the signals and the filters filter out any ripple. Sample and hold, amplifier, and filter circuits are well known in this area of technology and any circuitry for the stated purposes can be used.

Figure 3:
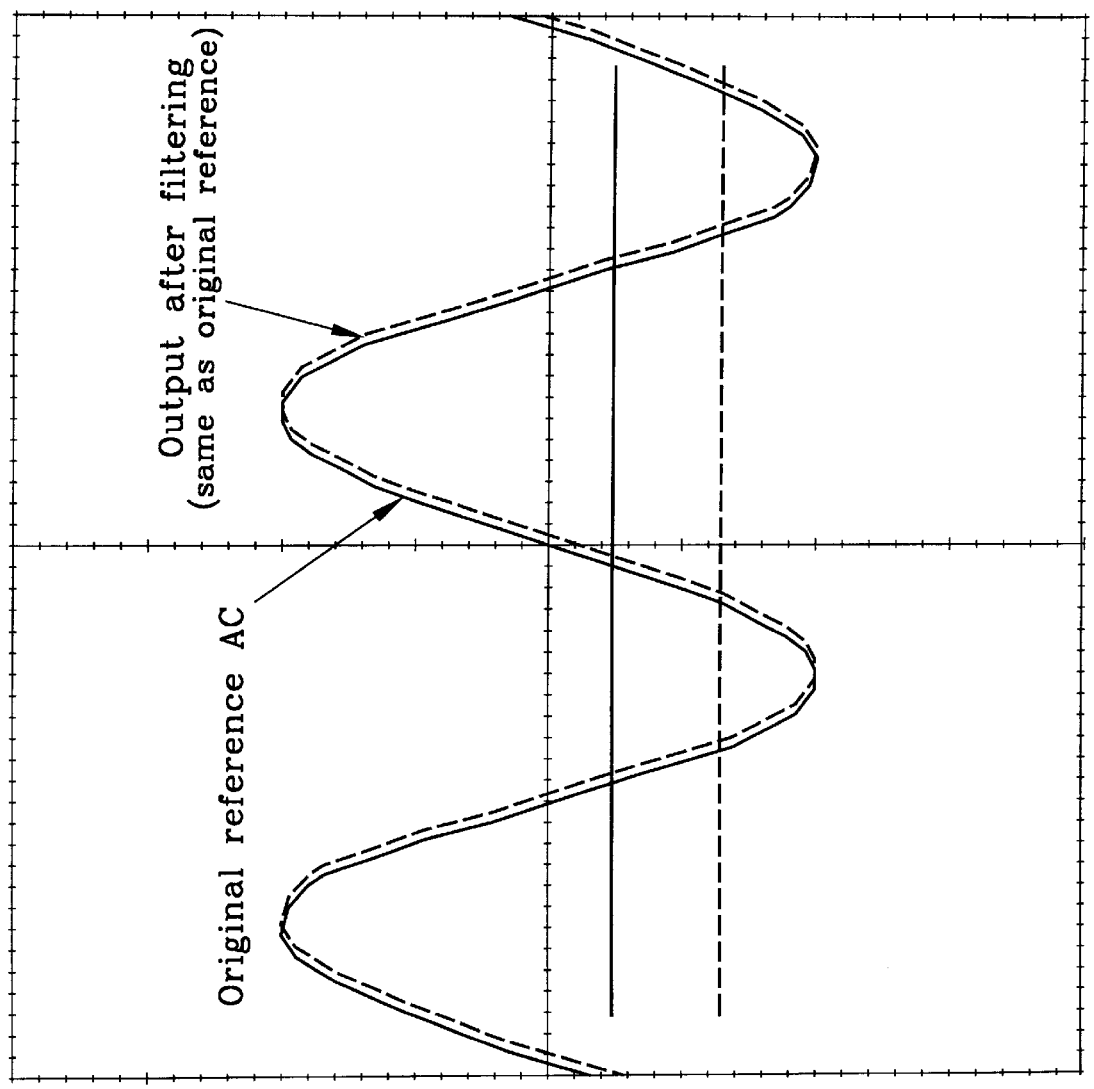
FIG. 3 shows the synchro signal output as compared to a reference signal.
Figure 4:
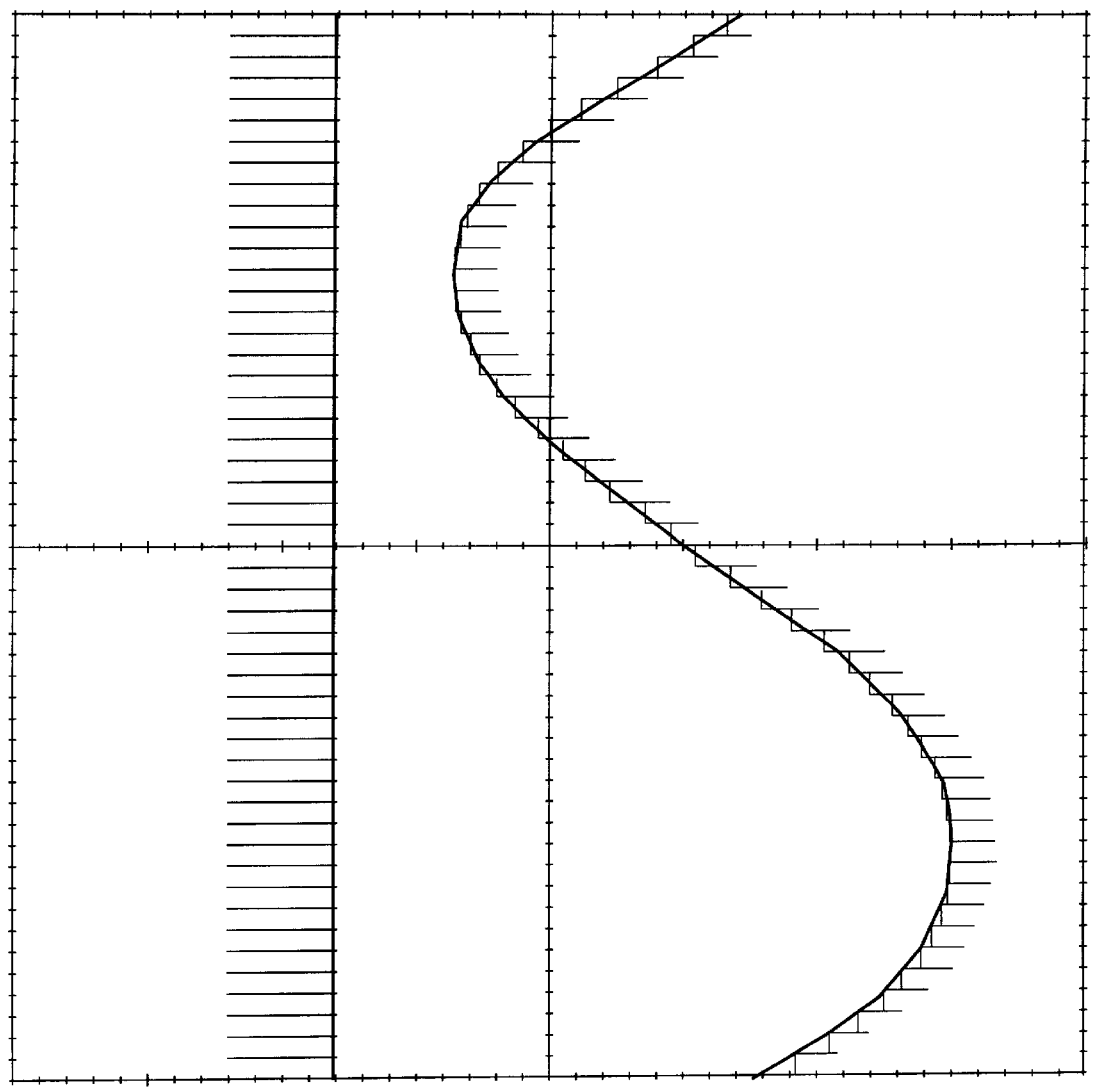
FIG. 4 shows a closer view of the synchro signal output.

As can be seen in FIG. 3, the signal is reproduced. FIG. 3 also shows the original signal. The original signal was also sent to the MDAC 2 as a reference. As can be seen in FIG. 3, the output signal is very accurate and closely corresponds to the original signal. FIG. 4 shows a more detailed view of the output of the dynamic digital synchro converter 1. As can be seen in FIG. 4, each sample and hold is clearly shown on the output. However, if the sample and hold are performed frequently, the output will have a more "smoothed" output. Therefore, all the synchro sample and hold circuitry 10 are updated on a cyclic basis via the MDAC 2 at a frequency of approximately 20 kHz for a 400 Hz reference signal. However, the present invention is not limited to this frequency, but any frequency at a frequency high enough above the frequency of the reference signal to "smooth" out the reproduced output signal can be used. In the present invention, the sample and hold circuitry 10 update at a frequency of at least 50 times the reference frequency to maintain the "smoothed" waveform linearity. With this frequency, very little degradation in the output waveform will result.

As mentioned before, it is of utmost importance to coordinate the values sent to the MDAC 2 as well as the sample and hold circuitry 10 and control the operations in reproducing the synchro signal. FIG. 5 shows a flow diagram of the steps involved in reproducing the synchro signal. For the present embodiment, the values are processed one loop at a time. For this example, it will be assumed that one loop of operation includes the operation of four sample and hold circuits. Firstly, the loop value is sent to the MDAC 2. The value to be sample and held is sent to the sample and hold circuit 10 and output. The loop number is increased and this continues until the loop number has reached one loop in which case, the loop number is reset and the loop begins anew for the next values. In the case of FIG. 5, the loop number is four. The value for loop number one is processed and output. Then the loop number becomes two. This number is not larger than the loop number which is four and then the processing begins for the value for loop number two. Once the loop number of four is reached, the loop number is reset to zero and the next loop of values are calculated. The number of cycles is not limited to four but used for example only. The number of cycles is variable and depends on such considerations as space available.

The invention has been described herein in detail in order to comply with the Patent Statutes and to provide those skilled in the art with the information needed to apply the novel principles and to construct and use such specialized materials and components as are required. However, it is to be understood that the invention can be carried out by specifically different materials and components, and that various modifications, both as to the processing details and operating procedures, can be accomplished without departing from the scope of the invention itself.

What is claimed is:

1. A digital to synchro converter, comprising:

means for outputting digital values;

a digital to analog converter receiving the digital values and converting the digital values to analog values;

plurality of means for restoring a synchro output signal based on the analog values received from the digital to analog converter; and apparatus for controlling the digital values to the converter and the analog values to the restoring means so that the synchro output signal is accurately represented.

2. The digital to synchro converter of claim 1, further comprising:

means for amplifing the output signal.

3. The digital to synchro converter of claim 1, further comprising:

means for filtering the output signal.

4. The digital to synchro converter of claim 1 wherein the digital to synchro converter, comprises only one digital to analog converter.

5. The digital to synchro converter of claim 1 wherein the digital to analog converter is a multiplying digital to analog converter.

6. The digital to synchro converter of claim 1, further comprising:

means for storing the digital values wherein storing means is connected to the outputting means.

7. The digital to synchro converter of claim 6 wherein the storing means is a dual port RAM.

8. The digital to synchro converter of claim 1 wherein the plurality of restoring means are sample and hold circuitry.

9. A digital to synchro converter, comprising in combination:

means for outputting digital values;

a single digital to analog converter receiving the digital values and converting the digital values to analog values based on a cycle;

plurality of means for restoring a synchro output signal based on the analog values received from the digital to analog converter and a reference signal indicating an original analog; and apparatus for controlling the digital values to the converter and the analog values to the restoring means so that the synchro output signal is accurately represented.

10. The digital to synchro converter of claim 9, further comprising:

means for amplifying the output signal.

11. The digital to synchro converter of claim 9, further comprising:

means for filtering the output signal.

12. The digital to synchro converter of claim 9 wherein the digital to analog converter is a multiplying digital to analog converter.

13. The digital to synchro converter of claim 9, further comprising:

means for storing the digital values wherein storing means is connected to the outputting means.

14. The digital to synchro converter of claim 13 wherein the storing means is a dual port RAM.

15. The digital to synchro converter of claim 9 wherein the plurality of restoring means are sample and hold circuitry.

16. The digital to synchro converter of claim 9, wherein the plurality of restoring means are sample and hold circuit, and wherein the sample and hold circuitry receives the analog values from the digital to analog converter.

17. The digital to synchro converter of claim 9 wherein the frequency of the cycle is fifty times the frequency of the reference signal.

18. A digital to synchro converter, comprising in combination:

a first processor operable to provide digital synchro values;

a memory coupled to the first processor, wherein the memory is operable to store the digital synchro values;

a digital-to-analog converter coupled to the memory, wherein the digital-to-analog converter is operable to convert the digital synchro values into analog synchro values;

sample-and-hold circuitry coupled to the digital-to-analog converter, wherein the sample-and-hold circuitry is operable to provide a synchro output from the analog synchro values; and a second processor coupled to the memory and the sample-and-hold circuitry, wherein the second processor is operable to specify which digital synchro values are transmitted from the memory to the digital-to-analog converter, and wherein the second processor is operable to specify when the sample-and-hold circuitry samples the analog synchro values from the digital-to-analog converter.

* * * * *

UNITED STATES PATENT AND TRADEMARK OFFICE
CERTIFICATE OF CORRECTION

PATENT NO. : 6,172,627
DATED : January 9, 2001
INVENTOR(S) : Windsor B. Nealy and Wesley C. Sewell It is certified that error appears in the above-identified patent and that said Letters Patent is hereby corrected as shown below:

Column 2, line 33, cancel "circuit" and substitute --circuitry--.

Signed and Sealed this

Twenty-ninth Day of May, 2001

Attest:

NICHOLAS P. GODICI

*Attesting Officer*     *Acting Director of the United States Patent and Trademark Office*